United States Patent
Cho et al.

(10) Patent No.: US 10,600,729 B2
(45) Date of Patent: Mar. 24, 2020

(54) SEMICONDUCTOR PACKAGE

(71) Applicant: SAMSUNG ELECTRONICS CO., LTD., Suwon-si, Gyeonggi-do (KR)

(72) Inventors: Kyong Soon Cho, Incheon (KR); Jae Eun Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/359,307

(22) Filed: Mar. 20, 2019

(65) Prior Publication Data

US 2019/0221513 A1  Jul. 18, 2019

Related U.S. Application Data

(63) Continuation of application No. 15/795,448, filed on Oct. 27, 2017, now Pat. No. 10,262,933.

(30) Foreign Application Priority Data

May 16, 2017 (KR) .................. 10-2017-0060356

(51) Int. Cl.
*H01L 21/70* (2006.01)
*H01L 23/50* (2006.01)
(Continued)

(52) U.S. Cl.
CPC .......... *H01L 23/50* (2013.01); *H01L 23/3128* (2013.01); *H01L 24/14* (2013.01); *H01L 24/32* (2013.01); *H01L 24/83* (2013.01); *H01L 24/91* (2013.01); *H01L 25/0655* (2013.01); *H01L 25/50* (2013.01); *H01L 21/563* (2013.01); *H01L 23/49827* (2013.01); *H01L 24/11* (2013.01); *H01L 24/13* (2013.01); *H01L 24/16* (2013.01); *H01L 24/29* (2013.01); *H01L 24/73* (2013.01); *H01L 24/81* (2013.01);
(Continued)

(58) Field of Classification Search
USPC ........... 257/499, 722, 779, E23.015, E23.02, 257/E23.023–E23.079, E21.508–E21.509, 257/E21.519, 673, 620; 438/613, 15, 438/106, 612–612
See application file for complete search history.

(56) References Cited

U.S. PATENT DOCUMENTS 7,179,683 B2    2/2007  Low et al.
7,682,872 B2    3/2010  Park et al.
(Continued)

FOREIGN PATENT DOCUMENTS

JP    2013-008963 A    1/2013
JP    2014-045027 A    3/2014
(Continued)

*Primary Examiner* — Niki H Nguyen
(74) *Attorney, Agent, or Firm* — Lee IP Law, P.C.

(57) ABSTRACT

A semiconductor package includes a substrate, a first semiconductor chip and a second semiconductor chip adjacent to each other on the substrate, and a plurality of bumps on lower surfaces of the first and second semiconductor chips. The first and second semiconductor chips have facing first side surfaces and second side surfaces opposite to the first side surfaces. The bumps are arranged at a higher density in first regions adjacent to the first side surfaces than in second regions adjacent to the second side surfaces.

20 Claims, 15 Drawing Sheets

(51) Int. Cl.
  *H01L 23/31* (2006.01)
  *H01L 23/00* (2006.01)
  *H01L 25/065* (2006.01)
  *H01L 25/00* (2006.01)
  *H01L 21/56* (2006.01)
  *H01L 23/498* (2006.01)

(52) U.S. Cl.
  CPC ............... *H01L 2224/0345* (2013.01); *H01L 2224/05008* (2013.01); *H01L 2224/05569* (2013.01); *H01L 2224/05572* (2013.01); *H01L 2224/1145* (2013.01); *H01L 2224/1146* (2013.01); *H01L 2224/1147* (2013.01); *H01L 2224/11452* (2013.01); *H01L 2224/13013* (2013.01); *H01L 2224/13099* (2013.01); *H01L 2224/13109* (2013.01); *H01L 2224/13111* (2013.01); *H01L 2224/13116* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13169* (2013.01); *H01L 2224/13171* (2013.01); *H01L 2224/1403* (2013.01); *H01L 2224/14051* (2013.01); *H01L 2224/14132* (2013.01); *H01L 2224/14152* (2013.01); *H01L 2224/14179* (2013.01); *H01L 2224/16225* (2013.01); *H01L 2224/16237* (2013.01); *H01L 2224/17517* (2013.01); *H01L 2224/26145* (2013.01); *H01L 2224/27436* (2013.01); *H01L 2224/291* (2013.01); *H01L 2224/2919* (2013.01); *H01L 2224/29035* (2013.01); *H01L 2224/301* (2013.01); *H01L 2224/30051* (2013.01); *H01L 2224/30505* (2013.01); *H01L 2224/32057* (2013.01); *H01L 2224/32058* (2013.01); *H01L 2224/32225* (2013.01); *H01L 2224/73103* (2013.01); *H01L 2224/73204* (2013.01); *H01L 2224/81191* (2013.01); *H01L 2224/81203* (2013.01); *H01L 2224/8385* (2013.01); *H01L 2224/83191* (2013.01); *H01L 2224/83192* (2013.01); *H01L 2224/83203* (2013.01); *H01L 2224/83986* (2013.01); *H01L 2224/9211* (2013.01); *H01L 2224/97* (2013.01); *H01L 2924/1431* (2013.01); *H01L 2924/15311* (2013.01); *H01L 2924/181* (2013.01); *H01L 2924/18161* (2013.01)

(56) References Cited

U.S. PATENT DOCUMENTS

| | | |
|---|---|---|
| 8,399,300 B2 | 3/2013 | Lee et al. |
| 9,196,538 B2* | 11/2015 | Hong ............... H01L 21/82 |
| 2003/0030134 A1* | 2/2003 | Tao ............... H01L 21/563 |
| | | 257/678 |
| 2010/0236821 A1 | 9/2010 | Park et al. |
| 2010/0244228 A1* | 9/2010 | Sakata ............... H01L 21/563 |
| | | 257/692 |
| 2011/0237028 A1 | 9/2011 | Hamazaki et al. |
| 2012/0228780 A1* | 9/2012 | Kim ............... H01L 23/36 |
| | | 257/774 |
| 2013/0093081 A1 | 4/2013 | Lin |
| 2015/0028473 A1 | 1/2015 | Kim et al. |
| 2016/0064359 A1 | 3/2016 | Kim et al. |
| 2016/0126161 A1* | 5/2016 | Fang ............... H01L 23/49811 |
| | | 257/741 |
| 2016/0351541 A1 | 12/2016 | Fukayama et al. |
| 2016/0379921 A1 | 12/2016 | Shin et al. |
| 2017/0243814 A1 | 8/2017 | Fang et al. |

FOREIGN PATENT DOCUMENTS

| | | |
|---|---|---|
| JP | 2016-225462 A | 12/2016 |
| KR | 10-2017-0000895 A | 1/2017 |

* cited by examiner

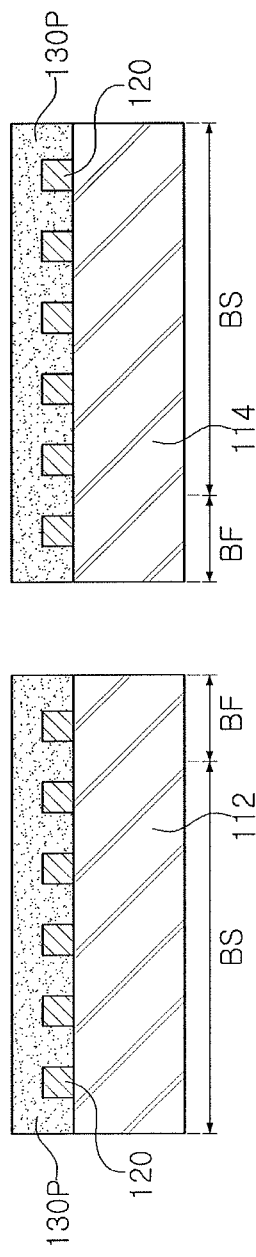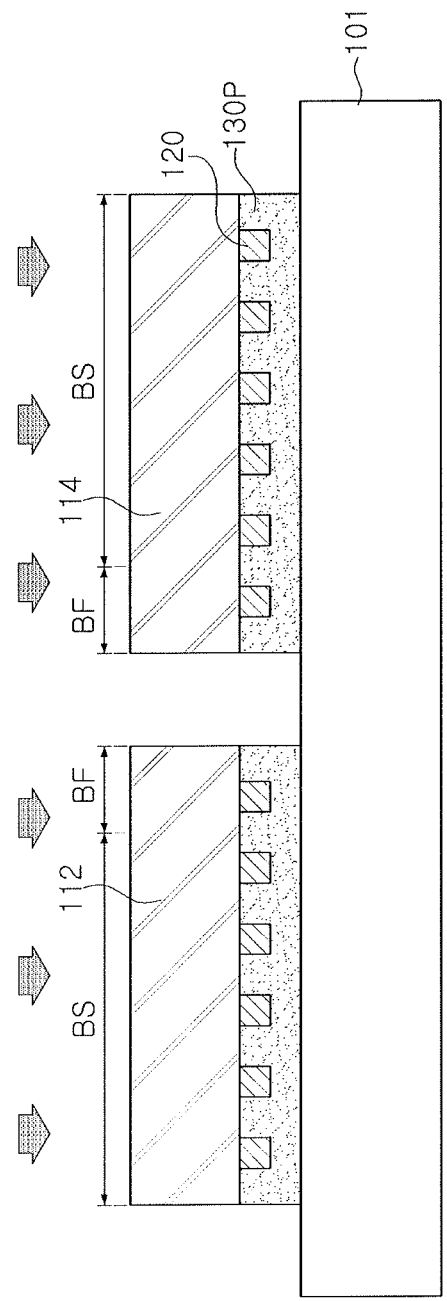

SEMICONDUCTOR PACKAGE

CROSS-REFERENCE TO RELATED APPLICATIONS

This is a continuation application based on pending application Ser. No. 15/795,448, filed Oct. 27, 2017, the entire contents of which is hereby incorporated by reference.

Korean Patent Application No. 10-2017-0060356 filed on May 16, 2017, in the Korean Intellectual Property Office, and entitled: "Semiconductor Package," is incorporated by reference herein in its entirety.

BACKGROUND

1. Field

Example embodiments of the present disclosure relate to a semiconductor package.

2. Description of the Related Art

A semiconductor package is formed by performing a packaging process on semiconductor chips which are manufactured by performing various semiconductor processes on a wafer. With the recent development of the electronic industry, there is a demand for high performance and miniaturization of electronic components. Accordingly, high integration, thinning, and microcircuit patterning are used in semiconductor packages.

SUMMARY

According to example embodiments, a semiconductor package may include a substrate, a first semiconductor chip and a second semiconductor chip adjacent to each other on the substrate, the first and second semiconductor chips having facing first side surfaces and second side surfaces opposite to respective ones of the first side surfaces, and a plurality of bumps on lower surfaces of respective ones of the first and second semiconductor chips, the bumps being arranged at a higher density in first regions of respective ones of the first and second semiconductor chips than in second regions of respective ones of the first and second semiconductor chips, the first regions of the first and second semiconductor chips being adjacent to the first side surfaces of the first and second semiconductor chips, respectively, and the second regions of the first and second semiconductor chips being adjacent to the second side surfaces of the first and second semiconductor chips, respectively.

According to example embodiments, a semiconductor package may include a substrate, least two semiconductor chips on the substrate, and a plurality of bumps on lower surfaces of respective ones of the at least two semiconductor chips. The plurality of bumps may be arranged at a higher density in adjacent regions of the at least two semiconductor chips than in other regions of the semiconductor chips.

According to example embodiments, a semiconductor package may include a substrate, at least two semiconductor chips, and a plurality of bumps arranged in rows and columns on the at least two semiconductor chips to connect the substrate to the at least two semiconductor chips. The plurality of bumps may include at least one first column of bumps arranged in a first direction along each of facing edges of the semiconductor chips and at least one second column of bumps arranged in the first direction and farther away from respective ones of the facing edges of the at least two semiconductor chips than the at least one first column of bumps. First bumps in the at least one first column of bumps may be arranged at a higher density than second bumps in the at least one second column of bumps.

BRIEF DESCRIPTION OF THE DRAWINGS

Features will become apparent to those of skill in the art by describing in detail exemplary embodiments with reference to the attached drawings, in which:

FIGS. 8A to 8E illustrate cross-sectional views of stages in a method of manufacturing a semiconductor package according to example embodiments.

DETAILED DESCRIPTION

Various example embodiments will now be described more fully with reference to the accompanying drawings in which some example embodiments are shown. However, embodiments may be embodied in many alternate forms and should not be construed as limited to only example embodiments set forth herein.

Figure 1:
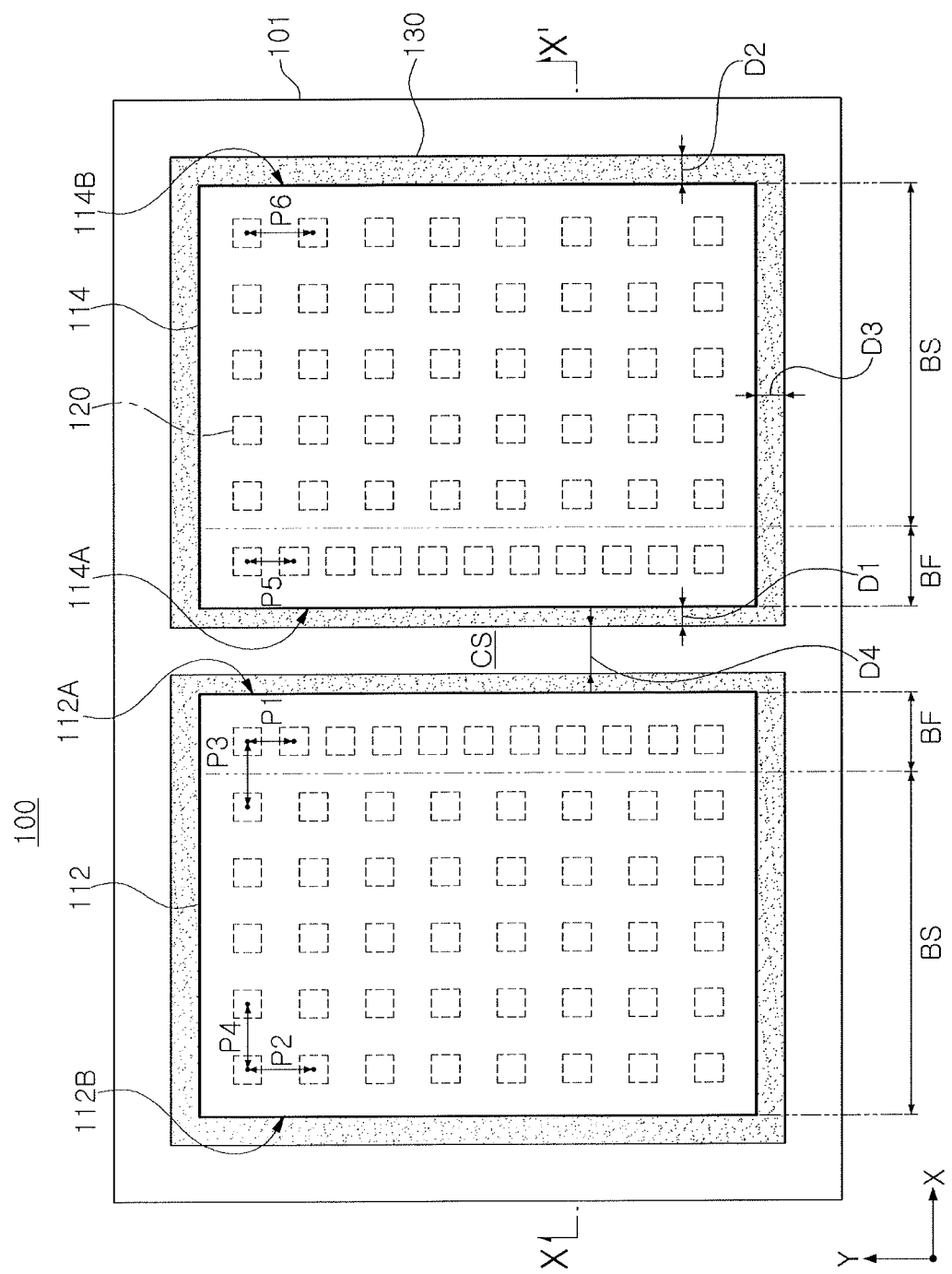
FIGS. 1 and 2 illustrate a plan view and a cross-sectional view, respectively, of a semiconductor package according to example embodiments.
Figure 2:
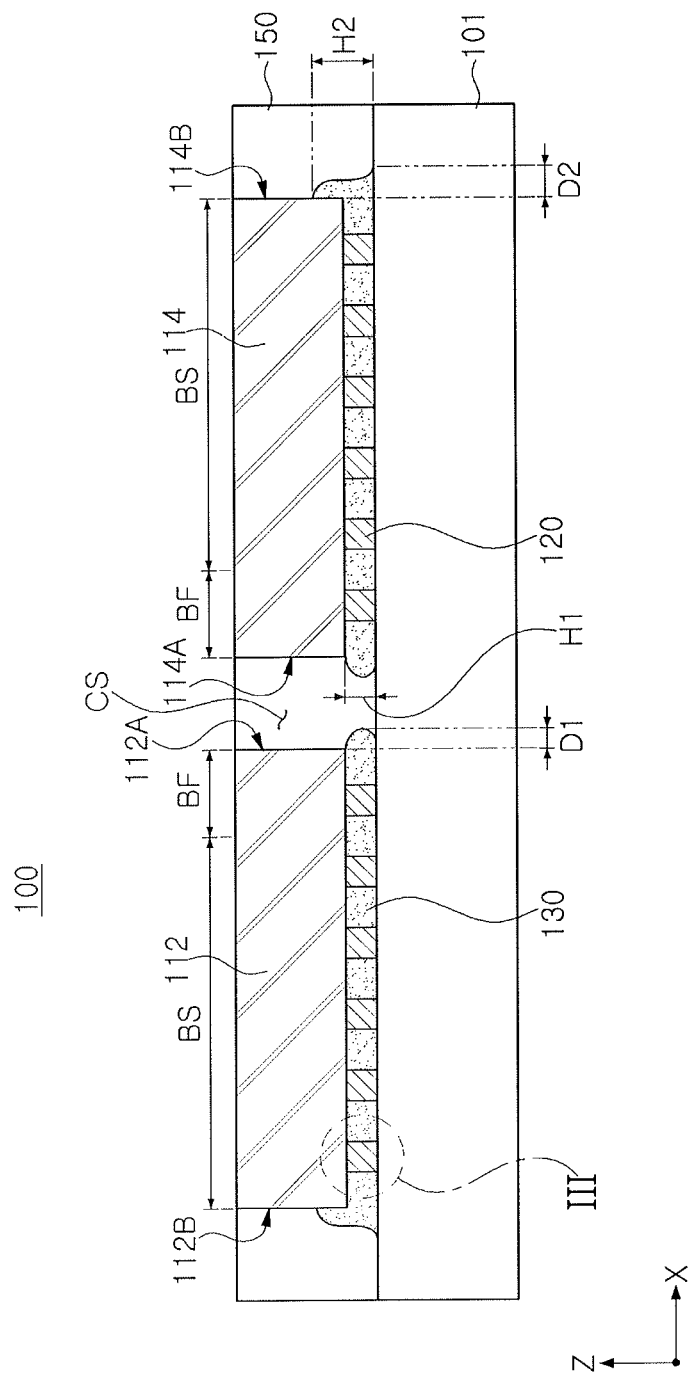

FIGS. 1 and 2 are a plan view and a cross-sectional view, respectively, illustrating a semiconductor package according to example embodiments. FIG. 2 illustrates a cross-sectional view taken along line X-X' in FIG. 1.

Referring to FIGS. 1 and 2, a semiconductor package 100 may include a substrate 101, a first semiconductor chip 112 and a second semiconductor chip 114 that are disposed on the substrate 101, bumps 120 and insulating layers 130 that are disposed between the substrate 101 and, e.g., each of, the first and second semiconductor chips 112 and 114, and a molding member 150 covering the first and second semiconductor chips 112 and 114.

The substrate 101 may include a semiconductor material, e.g., glass, ceramic or plastic. The substrate 101 may be a printed circuit board and may include a single or multi-layer structure. In an embodiment, the substrate 101 may include an insulating core layer including at least one of a prepreg resin, a thermosetting epoxy resin, a thermoplastic epoxy resin, and a resin containing filler, and conductive wiring patterns disposed above and below the insulating core layer. In some embodiments, the substrate 101 may be a wafer on which a semiconductor device is formed, or an interposer. For example, the substrate 101 may be a wafer on which an image sensor is formed.

The first semiconductor chip 112 and the second semiconductor chip 114 may be disposed side by side on the substrate 101. The first and second semiconductor chips 112 and 114 may be the same type or different types. For example, the first semiconductor chip 112 may be a logic chip, and the second semiconductor chip 114 may be a memory chip. The logic chip may be a micro-processor, e.g., a central processing unit (CPU), a controller, an application specific integrated circuit (ASIC), etc. The memory chip may be a volatile memory chip, e.g., a dynamic random-access memory (DRAM), a static random-access memory (SRAM), etc., or a nonvolatile memory chip, e.g., a flash memory, etc. The semiconductor package 100 may further include another semiconductor chip besides the first and second semiconductor chips 112 and 114. The first and second semiconductor chips 112 and 114, each of which has an upper surface or a lower surface that is an active surface, may be mounted on the substrate 101 in a face-up or face-down state.

The first and second semiconductor chips 112 and 114 may have facing first side surfaces 112A and 114A and opposite second side surfaces 112B and 114B, e.g., the first and second semiconductor chips 112 and 114 may be arranged on the substrate 101 to have the first side surfaces 112A and 114A thereof facing each other. The second side surface 112B of the first semiconductor chip 112 may be opposite to the first side surface 112A thereof. The second side 114B surface of the second semiconductor chip 114 may be opposite to the first side surface 114A thereof. The first and second semiconductor chips 112 and 114 may include first regions BF adjacent to the first side surfaces 112A and 114A, and second regions BS adjacent to the second side surfaces 112B and 114B. For example, each of the first and second semiconductor chips 112 and 114 may include first and second regions BF and BS adjacent to each other, such that each first region BF is between the corresponding first side surface and the second region BS. The first regions BF may be adjacent to each other. The second regions BS may be regions outside the first regions BF, i.e., spaced away from the corresponding first side surfaces 112A and 114A by the first regions BF. The first regions BF and second regions BS may be regions in which arrangements of the bumps 120 are different.

For example, as illustrated in FIG. 1, the first regions BF may be regions in which the bumps 120 are arranged in a column along the first side surfaces 112A and 114A or facing edges of the first and second semiconductor chips 112 and 114, e.g., each of the first regions BF may include a single column of bumps 120 along an edge of the corresponding first and second semiconductor chips 112 and 114. The second regions BS may be regions except the first regions BF, e.g., each of the second regions BS may be completely outside a corresponding first region BF and include a plurality of columns of bumps 120. However, perimeters of the first and second regions BF and BS are not limited to those illustrated in the drawings but may be variously changed. For example, the second regions BS may each be defined as a region in which one column of the bumps 120 are arranged adjacent to each of the second side surfaces 112B and 114B, on each of lower surfaces of the first and second semiconductor chips 112 and 114.

The bumps 120 may be disposed on the lower surfaces of the first and second semiconductor chips 112 and 114, as illustrated in FIG. 2, to electrically connect the first and second semiconductor chips 112 and 114 and the substrate 101. The bumps 120 may include a conductive material, e.g., metal or metal alloy (e.g., copper, aluminum, nickel, silver, gold, platinum, tin, lead, titanium, chrome, palladium, indium, zinc, carbon, or a mixture thereof). The bumps 120 are schematically illustrated in a tetragonal shape in the plan views according to example embodiments, but are not limited thereto. For example, the bumps 120 may have a circular, elliptical, rectangular, or pentagonal cross-section. The bumps 120 may have at least one of a spherical structure, a columnar structure, and a pillar structure.

Referring to FIG. 1, the bumps 120 may be arranged at a higher density, e.g., pitch, in the first regions BF of the first and second semiconductor chips 112 and 114 than in the second regions BS thereof. The bumps 120 may have substantially the same size, e.g., and shape, in the first and second regions BF and BS in top view. In the first region BF of the first semiconductor chip 112, the bumps 120 may be arranged at a first pitch P1 in a Y direction that is an extension direction of the first side surface 112A. In the second region BS of the first semiconductor chip 112, the bumps 120 may be arranged at a second pitch P2 greater than the first pitch P1 in the Y direction. Additionally, in the first region BF of the first semiconductor chip 112, the bumps 120 may be arranged at a third pitch P3 in an X direction perpendicular to the Y direction. In the second region BS of the first semiconductor chip 112, the bumps 120 may be arranged at a fourth pitch P4 in the X direction. For example, as illustrated in FIG. 1, when the first region BF includes a single column of bumps 120, the column of bumps 120 in the first region BF may be arranged at the third pitch P3 from an adjacent column of bumps 120 in the second region BS. The third pitch P3 may be substantially equal to the fourth pitch P4, but is not limited thereto.

In some embodiments, some of the bumps 120 may be dummy bumps, but are not limited thereto. For example, some of the bumps 120 in the first regions BF may be the dummy bumps.

The bumps 120 in the second semiconductor chip 114 may be arranged in a manner similar to those in the first semiconductor chip 112. In the first region BF of the second semiconductor chip 114, the bumps 120 may be arranged at a fifth pitch P5 in the Y direction that is an extension direction of the first side surface 114A, and, in the second region BS thereof, may be arranged at a sixth pitch P6 greater than the fifth pitch P5 in the Y direction. The fifth pitch P5 may be substantially equal to the first pitch P1, but is not limited thereto.

As such, the bumps 120 may be arranged at a high density in the Y direction in the first regions BF of the first and second semiconductor chips 112 and 114, such that an amount of material forming the insulating layers 130, flowing into a region CS between the first and second semiconductor chips 112 and 114 during a process of manufacturing the semiconductor package 100, may be reduced. The bumps 120 in the first regions BF may function to block, e.g., minimize, the flow of the material forming the insulating layers 130. Therefore, a volume of the insulating layers 130 in the region CS between the first and second semiconductor chips 112 and 114 may be reduced.

The insulating layers 130 may be disposed respectively between the substrate 101 and the first semiconductor chip 112 and between the substrate 101 and the second semiconductor chip 114 to function as an adhesion layer and an insulator. For example, one insulating layer 130 may be disposed between the substrate 101 and the first semiconductor chip 112 to surround, e.g., continuously each of, the bumps 120 on the first semiconductor chip 112, and one insulating layer 130 may be disposed between the substrate 101 and the second semiconductor chip 114 to surround, e.g., continuously each of, the bumps 120 on the second semiconductor chip 114. The bumps 120 may be insulated from one another by the insulating layers 130, e.g., a perimeter of each bump 120 in an X-Y plane may be completely surrounded by the insulating layers 130. The insulating layers 130 may include a material applied on the substrate 101 or on the first and second semiconductor chips 112 and 114 before bonding the first and second semiconductor chips 112 and 114 to the substrate 101 by a thermal compression (TC) process. The insulating layers 130 may include, e.g., a non-conductive film (NCF) or a non-conductive paste (NCP).

In the case in which the insulating layers 130 are formed of NCF, the insulating layers 130 may include resin, e.g., an acrylic resin or an epoxy resin. The insulating layers 130 may have a higher thermal expansion coefficient than the first and second semiconductor chips 112 and 114. For example, a thermal expansion coefficient of the first and second semiconductor chips 112 and 114 may range from about 1 ppm/K to about 5 ppm/K. The thermal expansion coefficient of the insulating layers 130 may range from about 40 ppm/K to 60 ppm/K.

The insulating layers 130 may be disposed under the first and second semiconductor chips 112 and 114, respectively, and may partially protrude outside the first and second semiconductor chips 112 and 114 in the X-Y plane. The insulating layers 130 may protrude by a first distance D1 from the first side surfaces 112A and 114A in the region CS between the first and second semiconductor chips 112 and 114. For example, as illustrated in FIG. 2, the insulating layers 130 may protrude toward each other in the region CS beyond respective ones of the first and second semiconductor chips 112 and 114 by the first distance D1 in the X direction. For example, as further illustrated in FIG. 2, a width of the region CS in the X direction may be larger than twice the distance D1, so outermost facing edges of the insulating layers 130 may be spaced apart from each other in the region CS to expose an upper surface of the substrate 101 between the first and second semiconductor chips 112 and 114.

The insulating layers 130 may protrude by a second distance D2 greater than the first distance D1 from, e.g., beyond, the second side surfaces 112B and 114B, in respective outer regions of the first and second semiconductor chips 112 and 114 opposite to the region CS. The insulating layers 130 may protrude by a third distance D3 from the other side surfaces of the first and second semiconductor chips 112 and 114, as illustrated in FIG. 1. The third distance D3 may be equal to or greater than the first distance D1 and may be equal to or smaller than the second distance D2.

Referring to FIG. 2, the insulating layers 130 may protrude outside the first regions BF of the first and second semiconductor chips 112 and 114 to have an outwardly curved surface and may have a first height H1 along a Z direction. The first height H1 may be substantially equal to a height, i.e., thickness, of the bumps 120. In this case, the insulating layers 130 may not extend on the first side surfaces 112A and 114A, but is not limited thereto. The insulating layers 130 may have a second height H2 greater than the first height H1 in the outer region outside the second regions BS. Thus, the insulating layers 130 may extend on the second side surfaces 112B and 114B.

An amount of the insulating layers 130 on the substrate 101 between adjacent ones of the bumps 120 in the first and second semiconductor chips 112 and 114 may be greater in the second regions BS than in the first regions BF. This is because the bumps 120 may be arranged at a lower density in the second regions BS than in the first regions BF.

The molding member 150 may encapsulate the first and second semiconductor chips 112 and 114 and the insulating layers 130. The molding member 150 may be disposed to expose the upper surfaces of the first and second semiconductor chips 112 and 114, but is not limited thereto. The molding member 150 may include, e.g., a silicone-based material, a thermosetting material, a thermoplastic material, a UV-treated material, or the like. The molding member 150 may include polymer such as resin, e.g., an epoxy molding compound (EMC). The molding member 150 may have a lower thermal expansion coefficient than the insulating layers 130. For example, the thermal expansion coefficient of the insulating layers 130 may range from about 40 ppm/K to 60 ppm/K, and the thermal expansion coefficient of the molding member 150 may range from about 3 ppm/K to about 20 ppm/K.

The molding member 150 may contact the substrate 101 around the first and second semiconductor chips 112 and 114. The molding member 150 may contact the substrate 101 in the region CS between the first and second semiconductor chips 112 and 114.

Figure 3A:
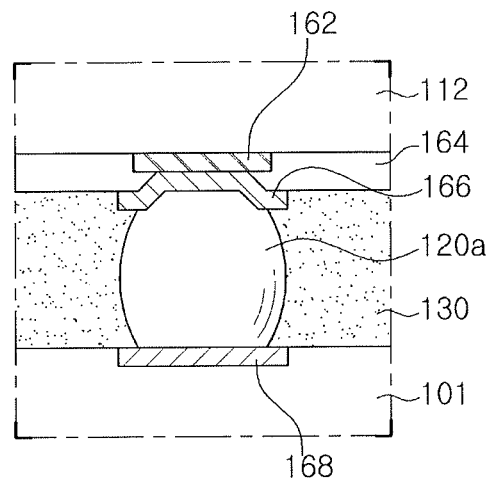
FIGS. 3A and 3B illustrate schematic cross-sectional views of bumps of a semiconductor package according to example embodiments.
Figure 3B:
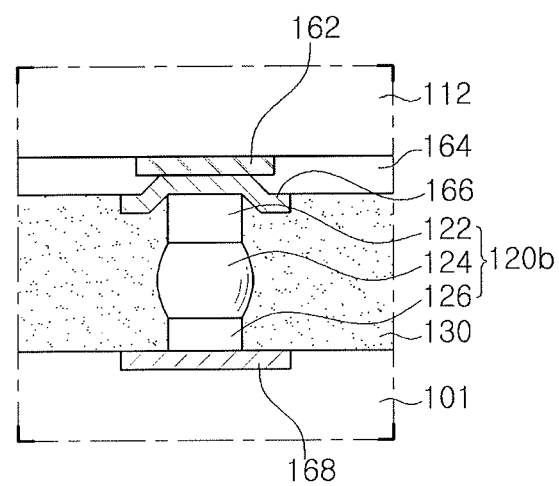

FIGS. 3A and 3B are schematic cross-sectional views illustrating bumps of a semiconductor package according to example embodiments. FIGS. 3A and 3B illustrate enlarged views of portion III of FIG. 2.

Referring to FIG. 3A, a bump 120a may be disposed to contact a connection pad 168 of the substrate 101 and a bump metal layer 166 on the lower surface of the first semiconductor chip 112, thereby electrically connecting the substrate 101 and the first semiconductor chip 112. The bump 120a may have a spherical shape or a ball shape. For example, the bump 120a may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

A conductive pad 162 may be disposed on the lower surface of the first semiconductor chip 112 and may be exposed by a passivation layer 164. The conductive pad 162 may be a redistribution layer and may be electrically connected to a conductive region of a semiconductor element in the first semiconductor chip 112.

The passivation layer 164 may act as a protection layer to cover the lower surface of the first semiconductor chip 112. The passivation layer 164 may include an insulating material, e.g., photosensitive polyimide (PSPI), silicon nitride, silicon oxide or the like.

The bump metal layer 166 may be connected to the conductive pad 162 in the passivation layer 164. The bump metal layer 166 may act as an adhesion layer and a blocking layer. The bump metal layer 166 may facilitate metal-to-metal bonding between the conductive pad 162 and the bump 120a and may prevent diffusion therebetween. The bump metal layer 166 may be an under bump metallurgy (UBM) layer, but is not limited thereto. In some embodiments, the bump metal layer 166 may have a laminated structure including multiple metal layers.

The connection pad 168 may be disposed on an upper surface of the substrate 101 and may include a conductive material.

Referring to FIG. 3B, a bump 120b may be disposed to contact the connection pad 168 on the upper surface of the substrate 101 and the bump metal layer 166 on the lower surface of the first semiconductor chip 112, thereby electrically connecting the substrate 101 and the first semiconductor chip 112. The bump 120b according to the example embodiments may include first and second pillar portions 122 and 126 and a solder portion 124.

The first and second pillar portions 122 and 126 may have a cylindrical shape or a polygonal columnar shape. The first pillar portion 122 may be formed to contact the bump metal layer 166, and the solder portion 124 may be formed to contact the first pillar portion 122. The second pillar portion 126 may be formed to contact the connection pad 168 and may be bonded to the solder portion 124. A plurality of bumps 120b may be arranged at a finer pitch because each of the bumps 120b includes first and second pillar portions 122 and 126.

The first and second pillar portions 122 and 126 may include metal including copper, or metal alloy, but are not limited thereto. The solder portion 124 may have a spherical shape or a ball shape. For example, the solder portion 124 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn or the like. In some embodiments, the bump 120b may have a structure without any one of the first and second pillar portions 122 and 126.

Although the structure of the bumps 120a and 120b has been specifically described with reference to FIGS. 3A and 3B, it is understood that this is an exemplary embodiment. The bumps 120 may have various shapes in example embodiments and may be connected to the first and second semiconductor chips 112 and 114 through various layers.

FIGS. 4 to 7 are plan views illustrating a bump arrangement of a semiconductor package according to example embodiments.

Figure 4:
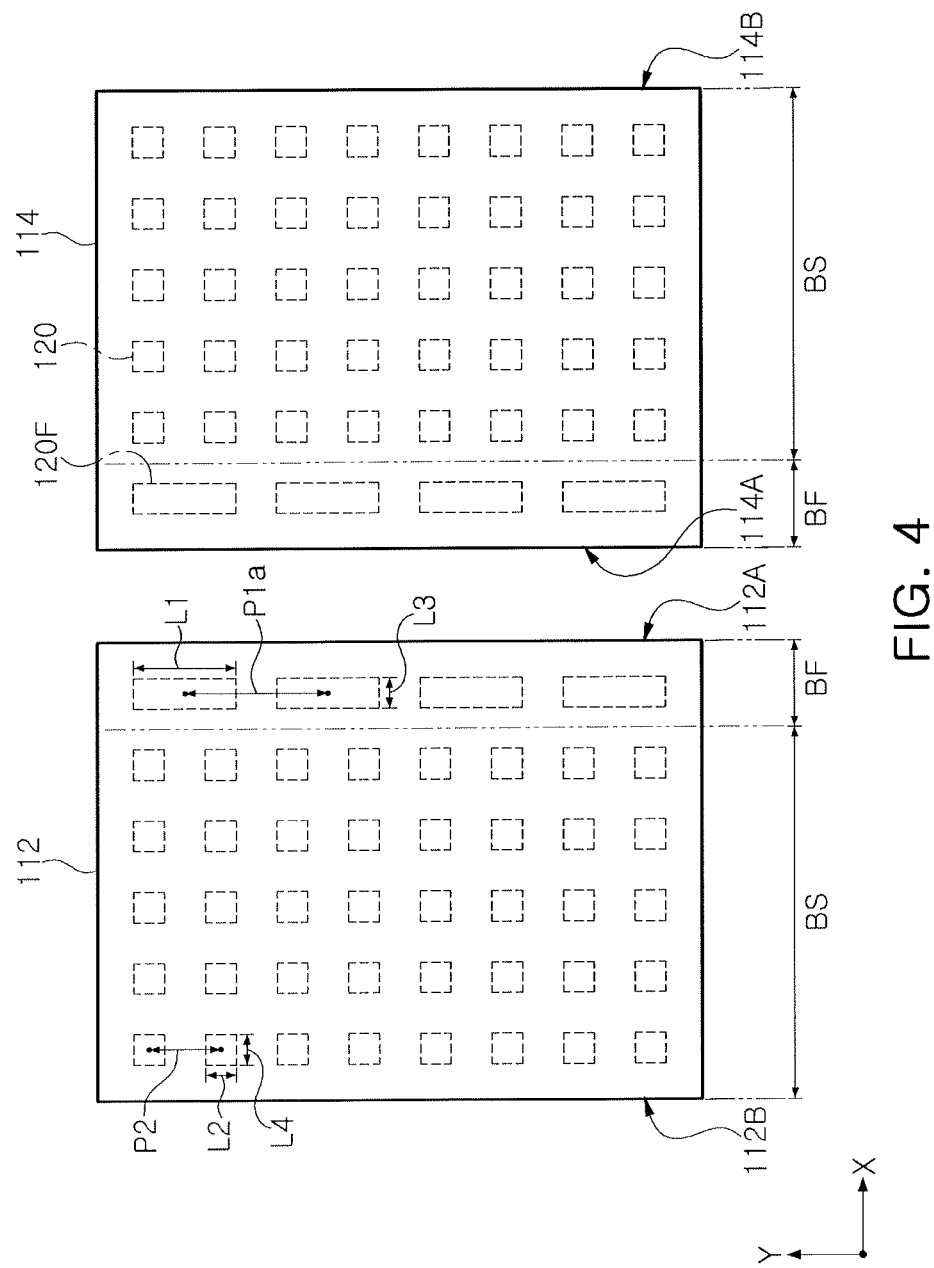
FIGS. 4 to 7 illustrate plan views of a bump arrangement of a semiconductor package according to example embodiments.

Referring to FIG. 4, bumps 120 and 120F may be disposed on the lower surface of the first and second semiconductor chips 112 and 114. The bumps 120F may be arranged at a higher density in the first regions BF of the first and second semiconductor chips 112 and 114 than in the second regions BS thereof.

The bumps 120F of the first regions BF may have a size, e.g., an area in top view, different from the bumps 120 of the second regions BS. The bumps 120F of the first regions BF may each have a first length L1 in the Y direction greater than a second length L2 of each of the bumps 120 of the second regions BS in the Y direction. For example, the first length L1 may be equal to or more than two times the second length L2. The bumps 120F of the first regions BF may each have a third length L3 in the X direction equal to or greater than a fourth length L4 of each of the bumps 120 of the second regions BS in the X direction. Thus, in an X-Y plane, the bumps 120F in the first regions BF may each have a greater cross-sectional area than each of the bumps 120 in the second regions BS.

The bumps 120F in the first regions BF may be arranged at a first pitch P1a in the Y direction, and the bumps 120 in the second regions BS may be arranged at a second pitch P2 smaller than the first pitch P1a in the Y direction. In this case, however, the first pitch P1a may be determined within a range in which the bumps 120F in the first regions BF are arranged at a higher density than the bumps 120 in the second regions BS.

Figure 5:
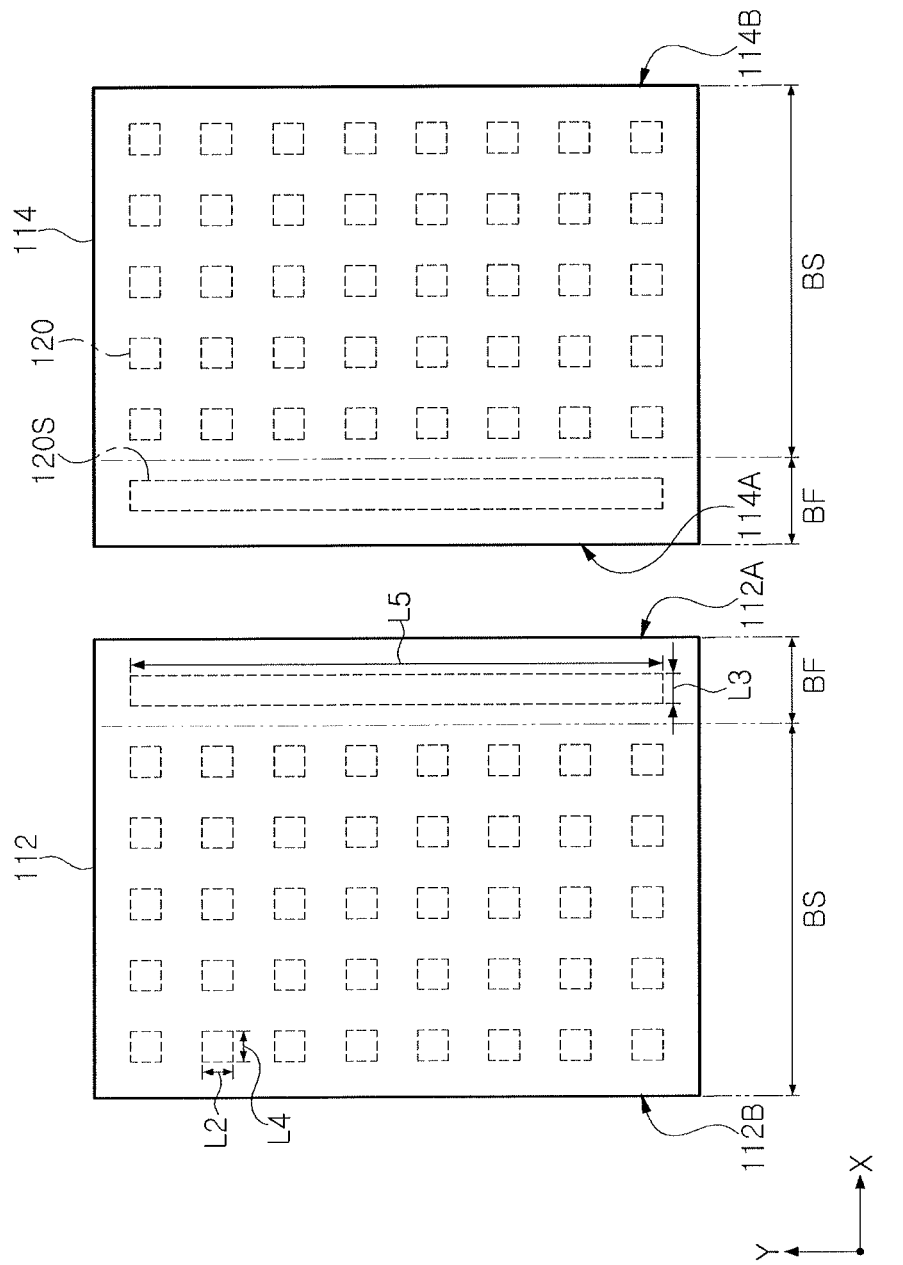

Referring to FIG. 5, bumps 120S may be arranged at a higher density in the first regions BF of the first and second semiconductor chips 112 and 114 than in the second regions BS thereof. The bumps 120S in the first regions BF may have a cuboid or elliptical shape extending along the first side surfaces 112A, 114A, respectively. For example, the bumps 120S in the first regions BF may be disposed one by one along respective ones of facing edges of the first and second semiconductor chips 112 and 114.

The bumps 120S in the first regions BF may each have a fifth length L5 in the Y direction. The fifth length L5 may be greater than a second length L2 of each of the bumps 120 in the second regions BS in the Y direction. The bumps 120S in the first regions BF may each have a third length L3 in the X direction. The third length L3 may be equal to or different from a fourth length L4 of each of the bumps 120 in the second regions BS in the X direction. In the X-Y plane, the bumps 120S in the first regions BF may each have a greater cross-sectional area than each of the bumps 120 in the second regions BS.

Figure 6:
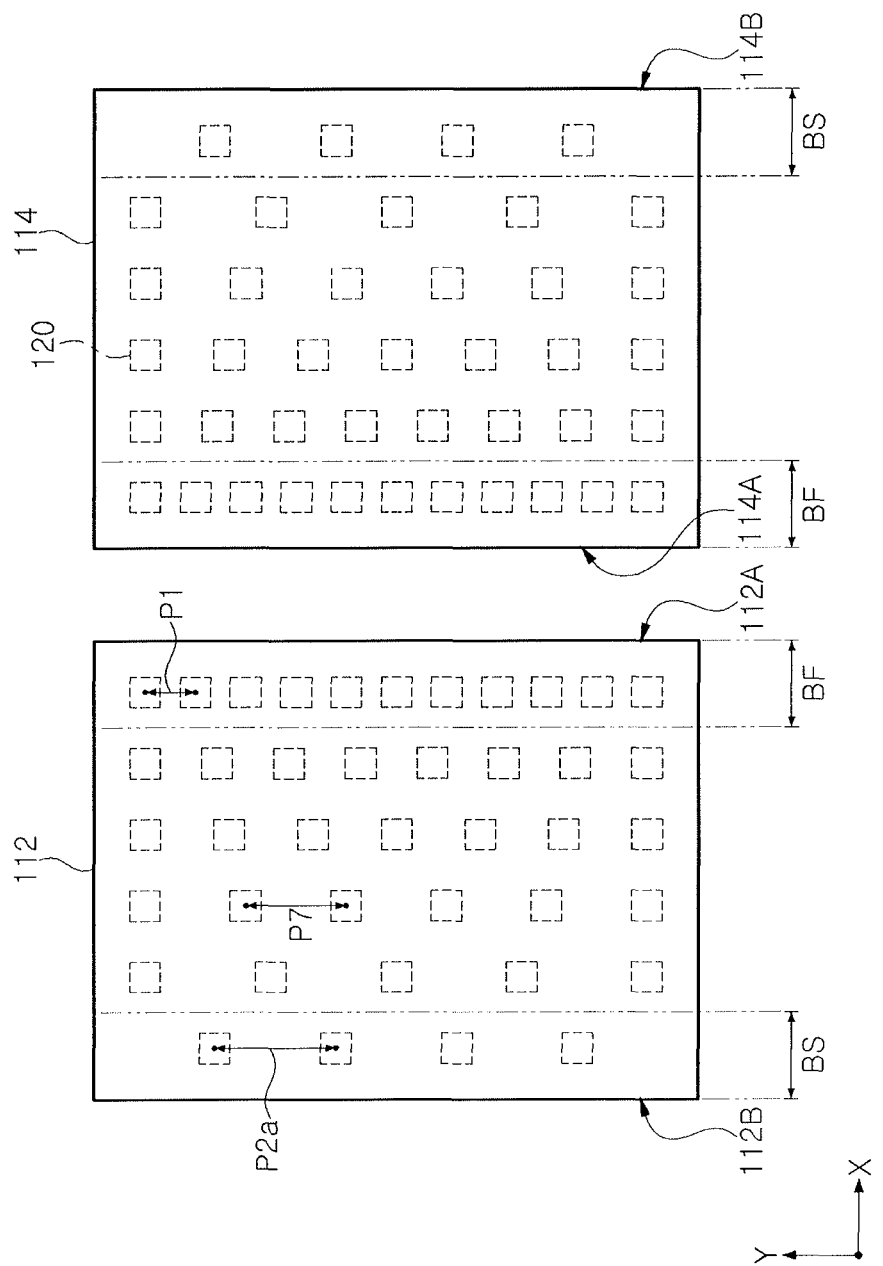

Referring to FIG. 6, the bumps 120 may be arranged at a higher density in the first regions BF of the first and second semiconductor chips 112 and 114 than in the second regions BS thereof. The bumps 120 may be arranged at a density gradually decreasing from the first side surfaces 112A and 114A to the second side surfaces 112B and 114B.

The second regions BS may each be referred to as a region including the bumps 120 arranged in one column in the Y direction. In this case, each of the first and second semiconductor chips 112 and 114 may include a region except for the first region BF and the second region BS. In some embodiments, the second regions BS may not be disposed immediately adjacent to second side surfaces 112B and 114B. In some embodiments, the first regions BF and the second regions BS may be regions adjacent to the first side surfaces 112A and 114A and the second side surfaces 112B and 114B, respectively, and may be variously defined.

The bumps 120 may have substantially the same size in the first and second regions BF and BS. The bumps 120 may be arranged at a first pitch P1 in the first regions BF in the Y direction, and may be arranged at a second pitch P2a in the second regions BS in the Y direction. Additionally, in regions between the first regions BF and the second regions BS, some of the bumps 120 may be arranged at a pitch P7 greater than the first pitch P1 and smaller than the second pitch P2a.

Figure 7:
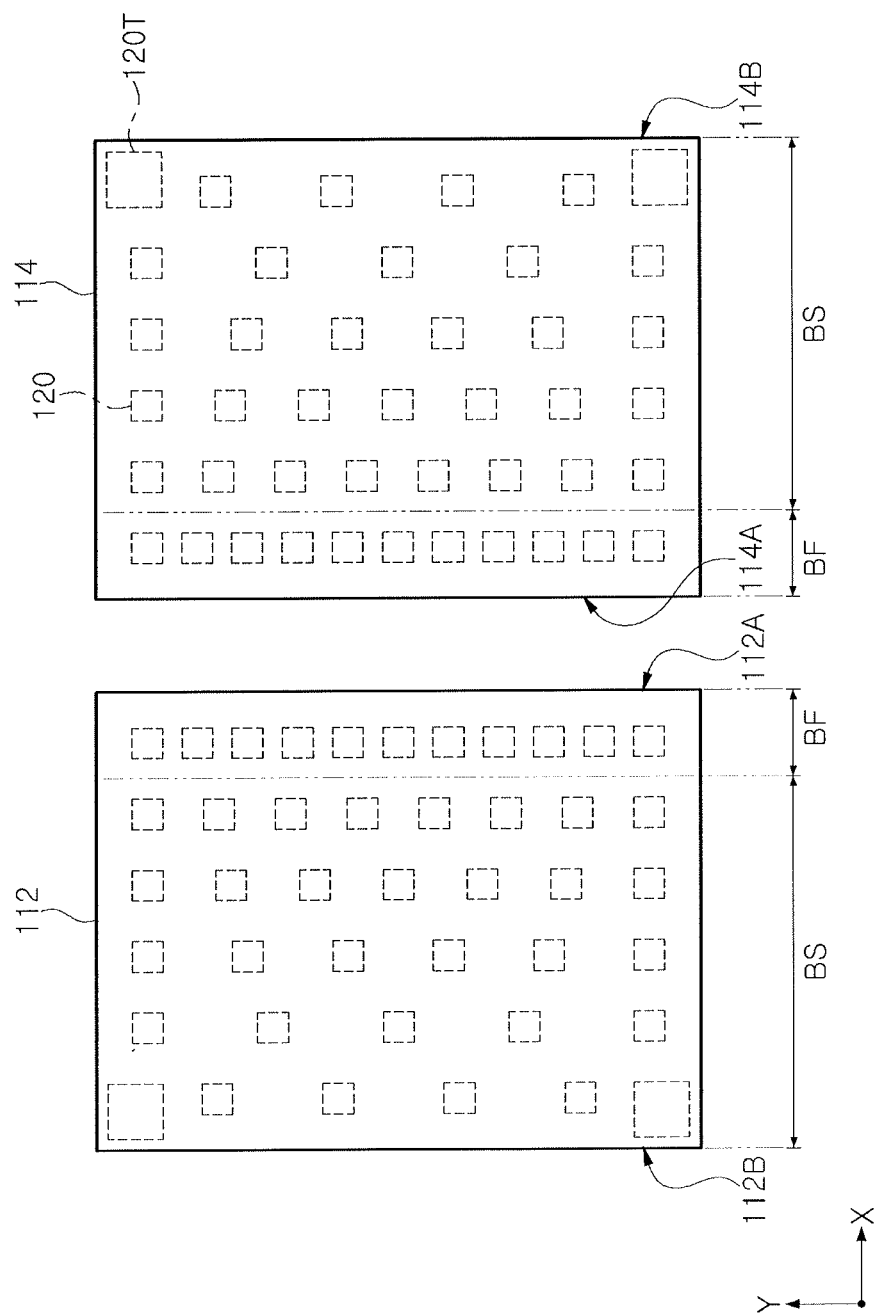

Referring to FIG. 7, the bumps 120 may be arranged at a higher density in the first regions BF of the first and second semiconductor chips 112 and 114 than in the second regions BS thereof. The bumps 120 may be arranged at the same manner as that described with reference to FIG. 6. However, support bumps 120T having a larger size, e.g., an area in top view, than the bumps 120 may be further disposed on the lower surfaces of the first and second semiconductor chips 112 and 114.

The support bumps 120T may disposed to increase support for the first and second semiconductor chips 112 and 114 in the second regions BS in which the density of the bumps 120 is relatively low. In some embodiments, at least one of the support bumps 120T may be a dummy bump, but is not limited thereto. The support bumps 120T may be disposed at corners of the first and second semiconductor chips 112 and 114 in the second regions BS, but are not limited thereto. The bumps 120 in the first regions BF may be arranged at a higher density than the bumps 120 and the support bumps 120T in the second regions BS.

FIGS. 8A to 8E are cross-sectional views illustrating stages in a method of manufacturing a semiconductor package according to example embodiments.

Figure 8A:
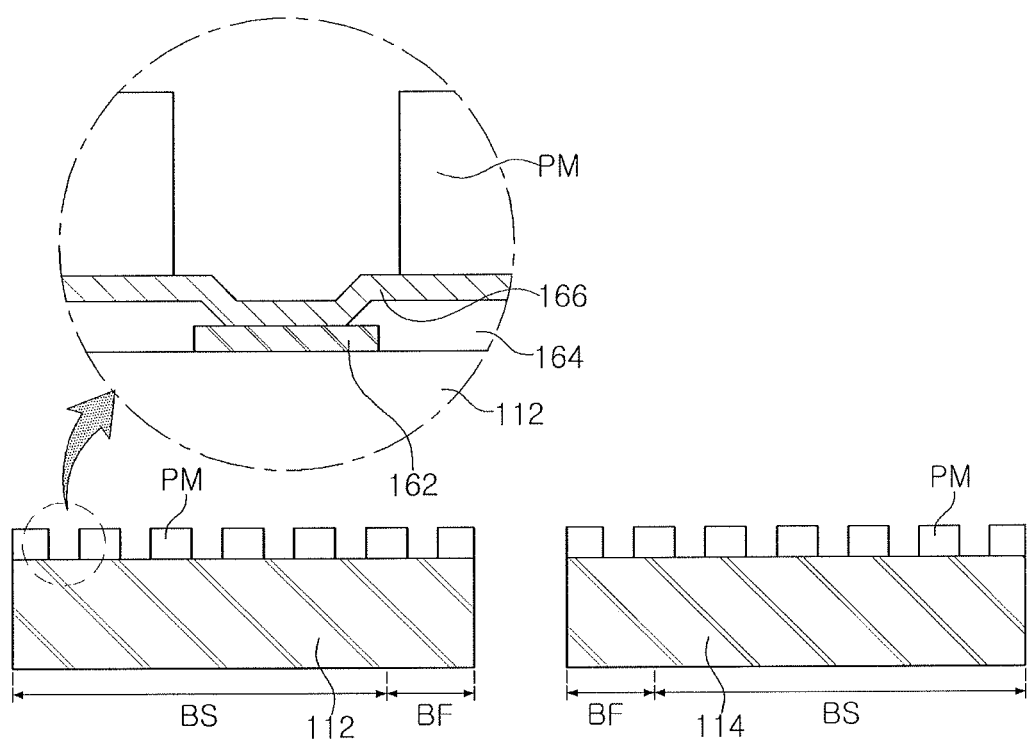

Referring to FIG. 8A, each of the first and second semiconductor chips 112 and 114 having a surface, on which the conductive pad 162, the passivation layer 164, and the bump metal layer 166 are formed, may be provided. A mask layer PM for forming the bumps 120 (refer to FIGS. 1 and 2) may be formed on the first and second semiconductor chips 112 and 114, e.g., on the bump metal layer 166.

The conductive pad 162 may include metal, e.g., aluminum. The conductive pad 162 may be formed by depositing a metal layer by, e.g., a sputtering process or a thermal evaporation process and patterning the metal layer. The conductive pad 162 may be formed to be electrically connected to a conductive region of a semiconductor element in each of the first and second semiconductor chips 112 and 114. The passivation layer 164 formed of an insulating material may be formed on the conductive pad 162.

The passivation layer 164 may include an insulating resin, e.g., a polyimide-based material. For example, when the passivation layer 164 is formed of photo-sensitive polyimide, the passivation layer 164 may be formed to expose a portion of the conductive pad 162, by depositing the photo-sensitive polyimide by a spin coating process and performing an exposure process on the photo-sensitive polyimide without forming an additional photoresist layer.

The bump metal layer 166 may be formed on the conductive pad 162 and the passivation layer 164. In the following electrolysis plating process, the bump metal layer 166 may act as a seed to plate metal. The bump metal layer 166 may include, e.g., at least one of titanium, copper, and titanium tungsten. The bump metal layer 166 may be formed by a chemical vapor deposition (CVD) process, a physical vapor deposition (PVD) process or an atomic layer deposition (ALD) process. In some embodiments, structures of the conductive pad 162, the passivation layer 164, and the bump metal layer 166 may be variously modified and some configurations thereof may be omitted.

The mask layer PM may be formed to have openings exposing the bump metal layer 166 at a location in which the bumps 120 are to be formed. The mask layer PM may be a photoresist layer. The openings may be formed at a higher density in the first regions BF of the first and second semiconductor chips 112 and 114 than in the second regions BS thereof.

Figure 8B:
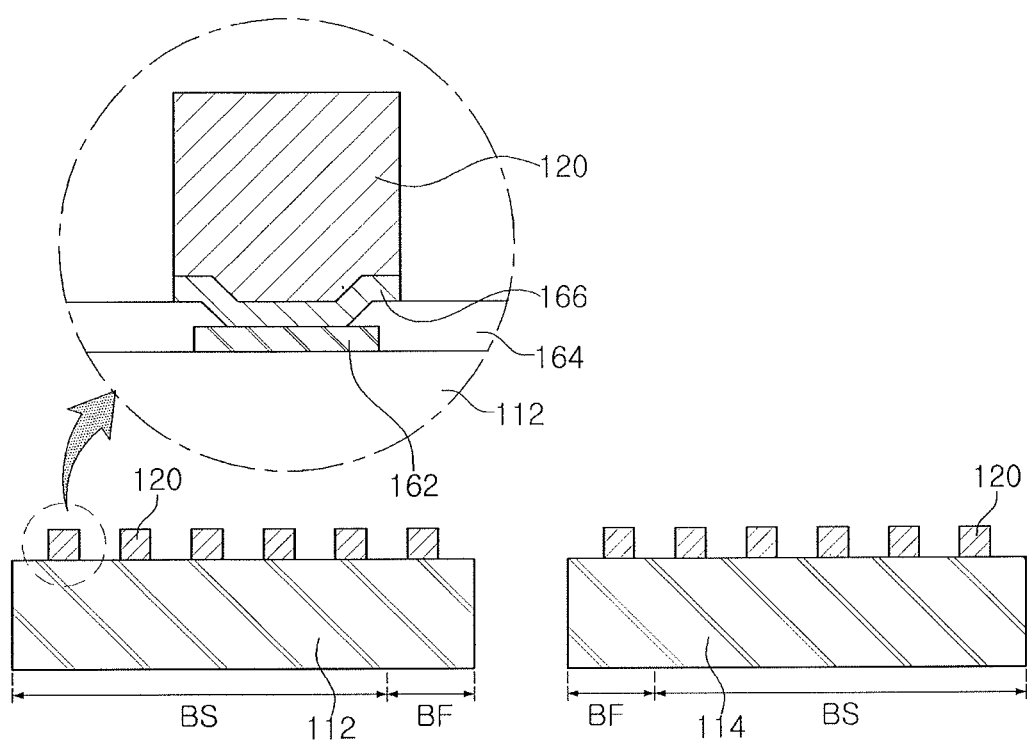

Referring to FIG. 8B, the bumps 120 may be formed in the openings of the mask layer PM, and then the mask layer PM may be removed. For example, as illustrated in FIG. 8B, the bumps 120 may be formed to have each bump 120 directly on a corresponding bump metal layer 166, e.g., so each bump 120 and a corresponding bump metal layer 166 have same widths and completely overlap each other.

The bumps 120 may be formed at a higher density in the first regions BF of the first and second semiconductor chips 112 and 114 than in the second regions BS thereof. The bumps 120 may be formed of a conductive material, e.g., copper. The bumps 120 may be formed by, e.g., an electrolysis plating process, a CVD process, or a PVD process, but are not limited thereto.

The mask layer PM may be removed by a dry etch process or a wet etch process. For example, when the mask PM is a photoresist layer, the mask layer PM may be removed by an ashing process and a strip process including a cleaning process.

Referring to FIG. 8C, an insulating film 130P may be formed on a surface of each of the first and second semiconductor chips 112 and 114, on which the bumps 120 are formed. For example, the insulating film 130P may cover all exposed surfaces of each of the bumps 120 and spaces therebetween.

The insulating film 130P may be a film type, e.g., a non-conductive film (NCF). The insulating film 130P may be laminated on each of the first and second semiconductor chips 112 and 114, but is not limited thereto. For example, the insulating film 130P may be attached on a surface of the substrate 101 (refer to FIGS. 1 and 2).

Referring to FIG. 8D, the first and second semiconductor chips 112 and 114 on which the insulating films 130P are laminated may be mounted on the substrate 101. That is, surfaces of the first and second semiconductor chips 112 and 114 including the insulating films 130P may be arranged to face the substrate 101 and be attached thereto, e.g., so the insulating films 130P are between the substrate 101 and the corresponding ones of the first and second semiconductor chips 112 and 114.

After the first and second semiconductor chips 112 and 114 and the substrate 101 are arranged to allow the bumps 120 to face the connection pad 168 (refer to FIGS. 3A and 3B) of the substrate 101, the first and second semiconductor chips 112 and 114 may be bonded to the substrate 101 by a bonding process. The bonding process may be performed by a thermal compression process. In this case, heat may be transmitted to the first and second semiconductor chips 112 and 114 while the first and second semiconductor chips 112 and 114 are compressed by a separate bonding tool, such that first and second semiconductor chips 112 and 114 may be bonded. By the compression, the bumps 120 may pass through the insulating films 130P before being hardened to reach the substrate 101 and then end portions thereof may be melted, such that the bumps 120 may be bonded to the substrate 101 to be electrically connected to the substrate 101. Such thermal compression process may be performed at relatively high temperature of, e.g., more than 250° C.

Figure 8E:
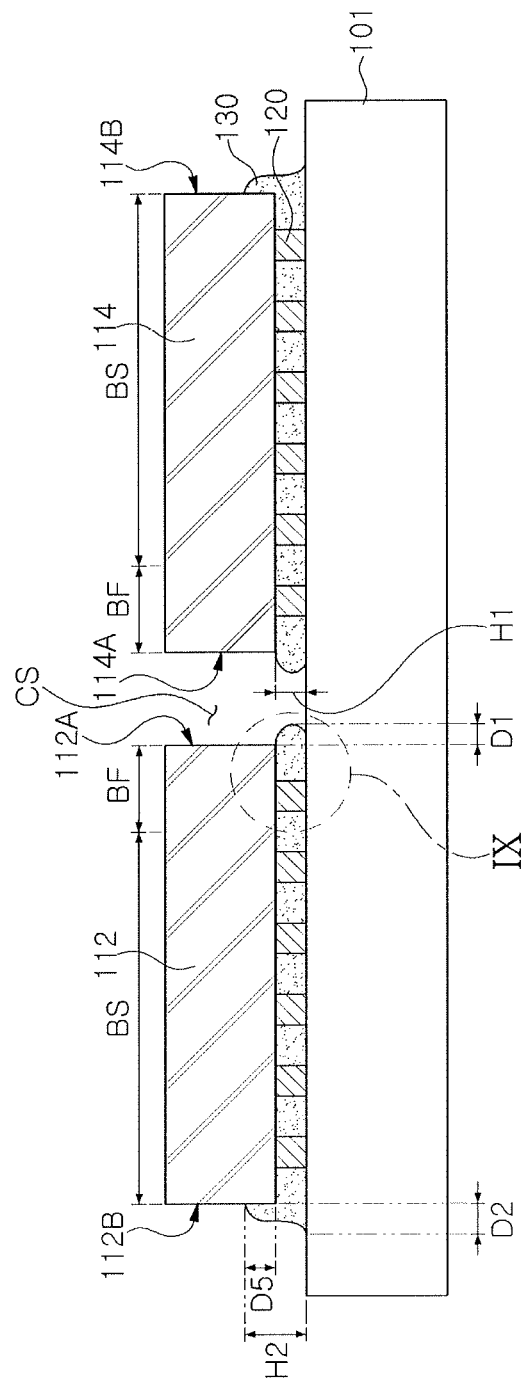

Referring to FIG. 8E, after performing the thermal compression process, the insulating films 130P may be hardened to form the insulating layers 130. The bumps 120 may be insulated from each other by the insulating layers 130.

In the thermal compression process, the insulating films 130P, before being hardened, may be forced out of the first and second semiconductor chips 112 and 114. At that time, since the bumps 120 are arranged at a relatively high density in the first regions BF of the first and second semiconductor chips 112 and 114, the insulating films 130P may flow toward the second regions BS thereof. The insulating films 130P may be blocked by the bumps 120 from flowing in the first regions BF of the first and second semiconductor chips 112 and 114. Thus, the flow of insulating films 130P from, e.g., beyond, the first side surfaces 112A and 114A of the first and second semiconductor chips 112 and 114, respectively, may be substantially smaller, as compared to the flow of insulating films 130P from the second side surfaces 112B and 114B of the first and second semiconductor chips 112 and 114, respectively.

Accordingly, the insulating layers 130 may be formed to have a relatively small volume in the region CS between the first and second semiconductor chips 112 and 114. The insulating layers 130 may each protrude by a first distance D1 from each of the first side surfaces 112A and 114A into the region CS between the first and second semiconductor chips 112 and 114, and may each protrude outward by a second distance D2 from each of the second side surfaces 112B and 114B. The second distance D2 may be greater than the first distance D1. In some embodiments, the insulating films 130P may partially creep up the second side surfaces 112B and 114B, e.g., extend at a predetermined height along the second side surfaces 112B and 114B, before hardening into the insulating layers 130. The insulating layers 130 may have a first height H1 in the region CS outside the first regions BF, and a second height H2 greater than the first height H1 outside the second regions BS, e.g., along the second side surfaces 112B and 114B. The insulating layers 130 may not extend on the first side surfaces 112A and 114A. The insulating layers 130 may extend on the second side surfaces 112B and 114B by a predetermined distance to cover the second side surfaces 112B and 114B.

Referring to FIGS. 2 and 8E, the molding member 150 may be formed to cover the first and second semiconductor chips 112 and 114. The molding member 150 may be formed of, e.g., an EMC, and may be formed at a temperature of about 150° C. to about 170° C. The insulating layers 130 may be formed of a material having a higher thermal expansion coefficient than the molding member 150 and the first and second semiconductor chips 112 and 114.

When the temperature around the first and second semiconductor chips 112 and 114 is reduced to a room temperature after forming the molding member 150, the molding member 150 may shrink, thereby causing warpage of the substrate 101. Such warpage of the substrate 101 may drastically increase in accordance with the volume and height of the insulating layers between the first and second semiconductor chips 112 and 114. In contrast, according to embodiments, since the bumps 120 in the first regions BF are arranged with a high density, thereby minimizing flow of the insulating films 130P therethrough, the volume and height H1 of the insulating layers 130 between the first and second semiconductor chips 112 and 114 (in the region CS) may be reduced. As such, warpage of the substrate 101 may be prevented from occurring.

Figure 9A:
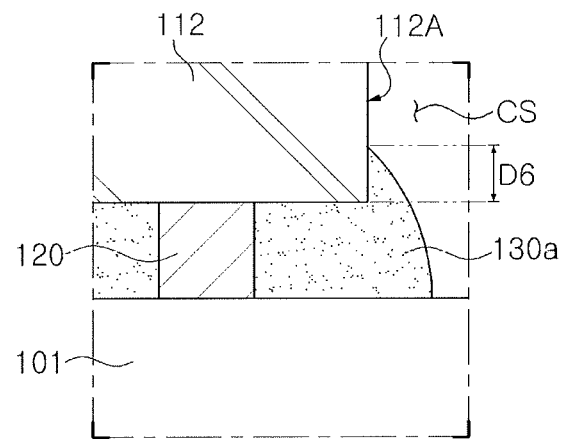
FIGS. 9A and 9B illustrate schematic cross-sectional views of insulating layers of a semiconductor package according to example embodiments.
Figure 9B:
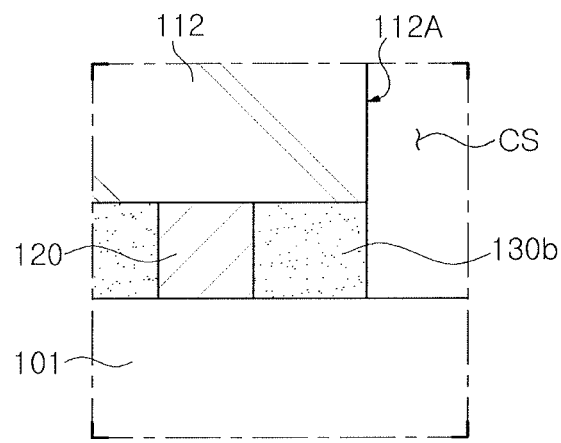

FIGS. 9A and 9B are schematic cross-sectional views illustrating insulating layers of a semiconductor package according to example embodiments. FIGS. 9A and 9B illustrate portion IX of FIG. 8E.

Referring to FIG. 9A, insulating layers 130a in the region CS between the first and second semiconductor chips 112 and 114 may extend onto the first side surfaces 112A and 114A of the first and second semiconductor chips 112 and 114 by a predetermined distance D6 to cover portions of the first side surfaces 112A and 114A. The distance D6 may be smaller than the distance D5 (refer to FIG. 8E) of the insulating layers 130 extending onto the second side surfaces 112B and 114B.

Referring to FIG. 9B, the insulating layers 130b in the region CS between the first and second semiconductor chips 112 and 114 may be disposed not to protrude outward from the first side surfaces 112A and 114A of the first and second semiconductor chips 112 and 114. Side surfaces of the insulating layers 130b may be coplanar with the first side surfaces 112A and 114A, respectively, but are not limited thereto. For example, the side surfaces of the insulating layers 130 may be positioned under the first and second semiconductor chips 112 and 114, respectively. In some embodiments, portions of the side surfaces of the insulating layers 130 contacting the substrate 101 may be positioned under the first and second semiconductor chips 112 and 114.

Figure 10:
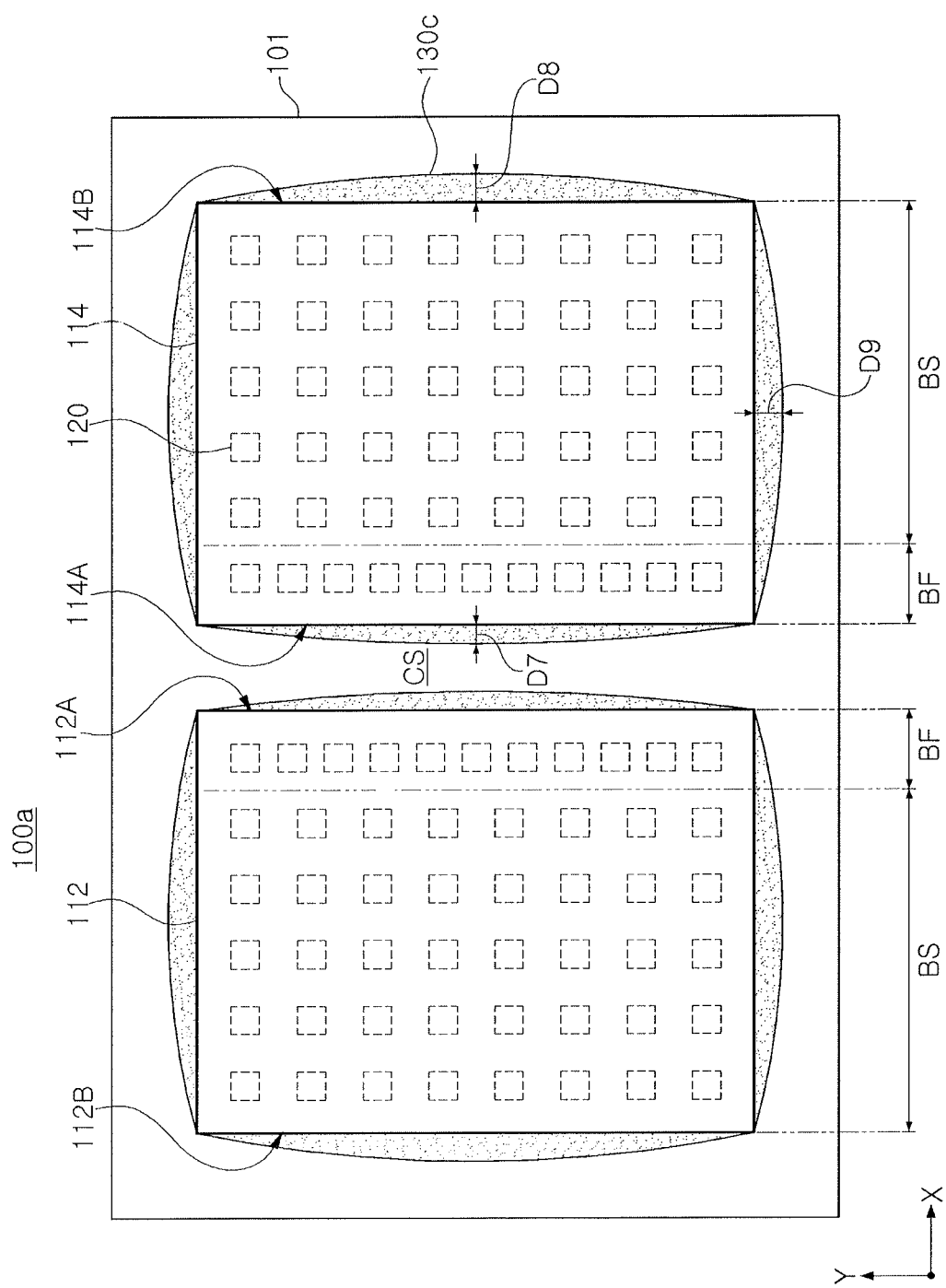
FIG. 10 illustrates a schematic plan view of a semiconductor package according to example embodiments.

FIG. 10 is a schematic plan view illustrating a semiconductor package according to example embodiments.

Referring to FIG. 10, a semiconductor package 100a may have the same structure as the semiconductor package 100 described with reference to FIG. 1, except for insulating layers 130c having different configurations. The insulating layers 130c may protrude outside the first and second semiconductor chips 112 and 114, except for corner portions thereof. The insulating layers 130c may protrude outward by a seventh distance D7 from the first side surfaces 112A and 114A of the first and second semiconductor chips 112 and 114 in the region CS, and may protrude outward by a eighth distance D8 greater than the seventh distance D7 from the second side surfaces 112B and 114B thereof. The insulating layers 130c may protrude outward by a ninth distance D9 from the other side surfaces thereof. The ninth distance D9 may be equal to or greater than the seventh distance D7 and may be equal to or smaller than the eighth distance D8.

The insulating layers 130c may have various shapes within a range in which the seventh distance D7 is smaller than the eighth distance D8. In some embodiments, the seventh distance D7 may be zero. The insulating layers 130c may not protrude outward from the first side surfaces 112A and 114A of the first and second semiconductor chips 112 and 114. In some embodiments, the insulating layers 130c may be connected to each other in the region CS between the first and second semiconductor chips 112 and 114 to form a single layer.

Figure 11:
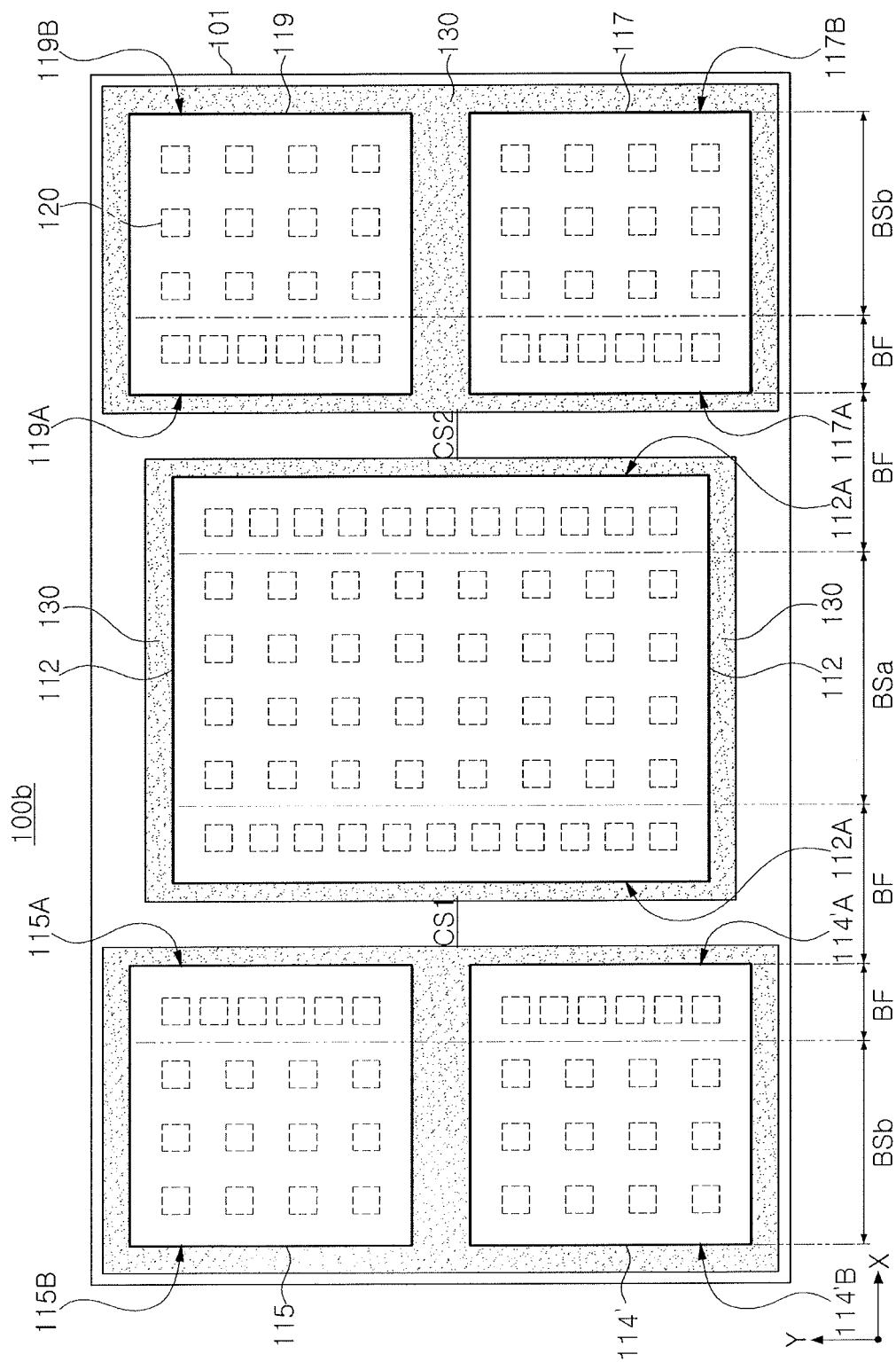
FIG. 11 illustrates a schematic plan view of a semiconductor package according to example embodiments.

FIG. 11 is a schematic plan view illustrating a semiconductor package according to example embodiments.

Referring to FIG. 11, a semiconductor package 100b may include three or more semiconductor chips 112, 114', 115, 117 and 119, unlike the semiconductor package 100 described with reference to FIG. 1.

For example, the first semiconductor chip 112 may be disposed at a central region of the substrate 101, and a second semiconductor chip 114', a third semiconductor chip 115, a fourth semiconductor chip 117, and a fifth semiconductor chip 119 may be disposed two-by-two on opposite sides of the first semiconductor chip 112. For example, as shown in FIG. 11, the second and third semiconductor chips 114' and 115 may be disposed on a left side of the first semiconductor chip 112, and the fourth and fifth semiconductor chips 117 and 119 may be disposed at a right side of the first semiconductor chip 112. Thus, opposite side surfaces of the first semiconductor chip 112 in the X direction may be the first side surfaces 112A facing the second to fifth semiconductor chips 114', 115, 117 and 119. The first semiconductor chip 112 may include two first regions BF adjacent the first side surfaces 112A and a second region BSa between the two first regions BF.

The second to fifth semiconductor chips 114', 115, 117 and 119 may have first side surfaces 114A', 115A, 117A and 119A, facing the first side surfaces 112A of the first semiconductor chip 112 and second side surfaces 114B', 115B, 117B and 119B opposite to the first side surfaces 114A', 115A, 117A and 119A. The second to fifth semiconductor chips 114', 115, 117 and 119 may include first regions BF adjacent to the first side surfaces 114A', 115A, 117A and 119A and second regions BSb adjacent to the second side surfaces 114B', 115B, 117B and 119B. In some embodiments, regions adjacent to facing side surfaces of the second and third semiconductor chips 114' and 115 and to facing side surfaces of the fourth and fifth semiconductor chips 117 and 119 may be referred to as first regions BF, and thus, the bumps 120 may be arranged.

The bumps 120 may be arranged at a higher density in the first regions BF of the first to fifth semiconductor chips 112 to 119 than in the second regions BSa and BSb thereof in the Y direction.

The insulating layers 130 may be disposed below the first to fifth semiconductor chips 112 to 119, respectively, and may partially protrude outside the first to fifth semiconductor chips 112 to 119. The insulating layers 130 may be connected to each other between the second and third semiconductor chips 114' and 115 and between the fourth and fifth semiconductor chips 117 and 119, but are not limited thereto. The insulating layers 130 may be disposed to be separated from each other in regions CS1 and CS2 between the first semiconductor chip 112 and the other semiconductor chips 114' to 119. The insulating layers 130 may protrude outward by a smaller distance from the first side surfaces 112A to 119A of the first to fifth semiconductor chips 112 to 119 than from the other side surfaces thereof.

Although the arrangement of five semiconductor chips 112 to 119 are described in FIG. 11, the example embodiments are not limited thereto. The number of the semiconductor chips may be variously changed.

Figure 12:
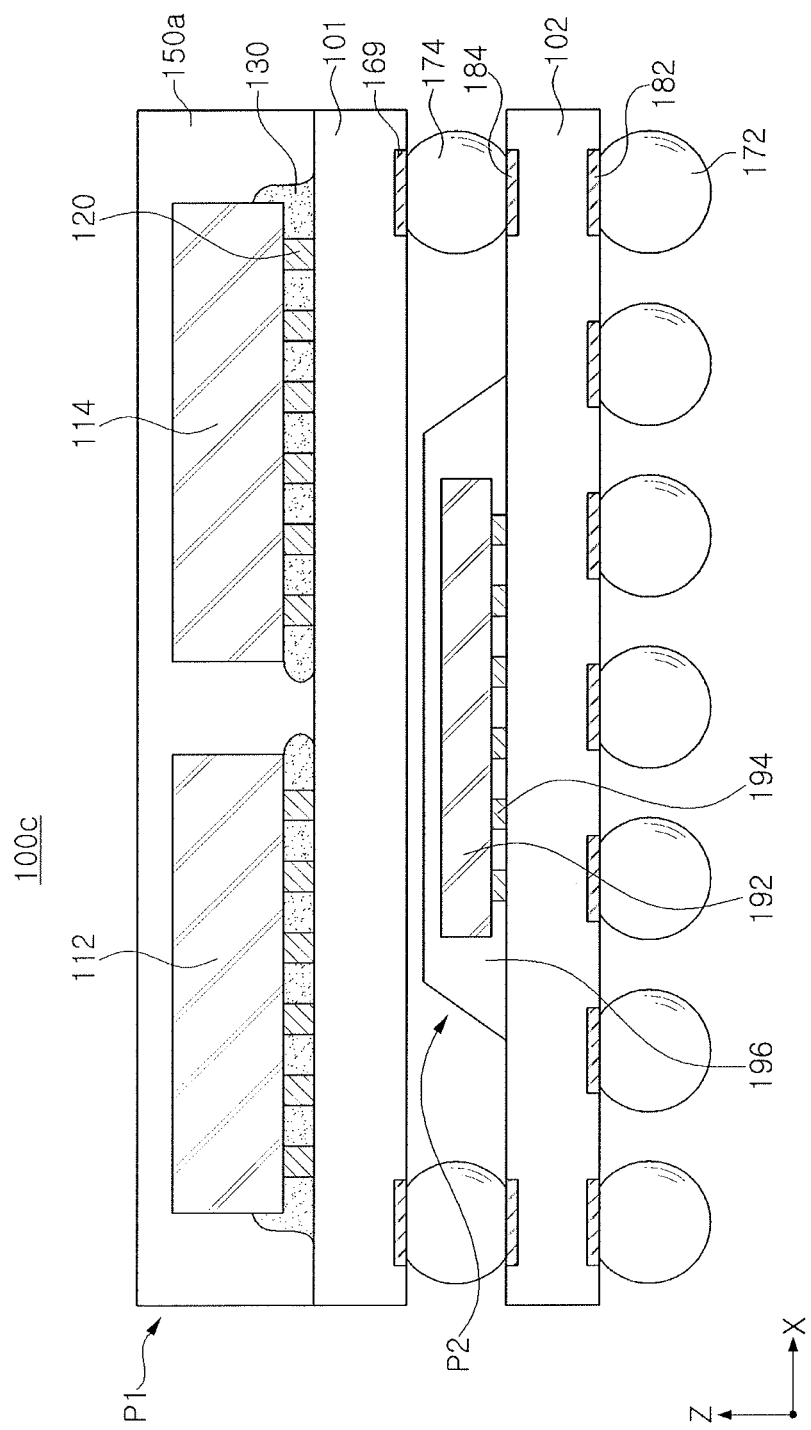
FIG. 12 illustrates a schematic cross-sectional view of a semiconductor package according to example embodiments.

FIG. 12 is a schematic cross-sectional view illustrating a semiconductor package according to example embodiments.

Referring to FIG. 12, a semiconductor package 100c may include a first semiconductor package P1 and a second semiconductor package P2. The semiconductor package 100c may be a package-on-package (POP) type in which the first package P1 is stacked on the second package P2.

The first package P1 may include the substrate 101, the first semiconductor chip 112 and the second semiconductor chip 114 that are disposed on the substrate 101, the bumps 120 and the insulating layers 130 that are disposed between the substrate 101 and the first and second semiconductor chips 112 and 114, and a molding member 150a covering the first and second semiconductor chips 112 and 114. The first package P1 may have the same structure as the semiconductor package 100 described with reference to FIGS. 1 and 2, except for the molding member 150a. That is, the first package P1 may include the first and second semiconductor chips 112 and 114, and the molding member 150a may be disposed to encapsulate the first and second semiconductor chips 112 and 114 (or cover at least side surfaces and upper surfaces of the first and second semiconductor chips 112 and 114), but is not limited thereto. As such, the first semiconductor package P1 may include the bumps 120 in the first and second semiconductor chips 112 and 114 arranged in the manner described in the aforementioned embodiments (described previously with reference to FIGS. 1-8E), and may configure a portion of the semiconductor package 100c.

The second package P2 may include a lower substrate 102, a lower semiconductor chip 192, lower bumps 194, and a lower molding member 196. Structures or configurations of the lower substrate 102, the lower semiconductor chip 192, the lower bumps 194, and the lower molding member 196 may be the same as or similar to those of the substrate 101, the bumps 120, the insulating layers 130, and the molding member 150, described with reference to FIGS. 1 and 2. However, the lower molding member 196 may be disposed at a central portion of the lower substrate 102 so that connection solder balls 174 may be disposed to connect the first semiconductor package P1 and the second semiconductor package P2. The second semiconductor package P2 may include one semiconductor chip, but is not limited thereto. In some embodiments, the second semiconductor package P2 may include a system-in-package (SIP) including a plurality of semiconductor chips.

Conjunction solder balls 172 may be disposed on a lower surface of the lower substrate 102. The conjunction solder balls 172 may be disposed to be connected to lower pads 182 of the lower substrate 102. The first and second semiconductor packages P1 and P2 may be electrically connected to an external device, e.g., a system substrate or a main board by the conjunction solder balls 172. The first and second semiconductor packages P1 and P2 may be electrically connected to each other by the connection solder balls 174. Upper pads 184 of the lower substrate 102 and lower pads 169 of the substrate 101 may be electrically connected by the conjunction solder balls 172 disposed therebetween.

In the semiconductor package 100c of the package-on-package type according to example embodiments, warpage of the first semiconductor package P1 may be prevented from occurring such that reliability of the whole semiconductor package 100c may be improved. The first semiconductor package P1 positioned at an upper portion of the semiconductor package 100c may be a semiconductor package to which the arrangement of the bumps 120 according to the aforementioned embodiments is applied, but is not limited thereto.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a substrate;
at least two semiconductor chips on the substrate;
  a plurality of bumps on lower surfaces of respective ones of the at least two semiconductor chips, the plurality of bumps being arranged at a higher density in adjacent regions of the at least two semiconductor chips than in other regions of the at least two semiconductor chips; and
  at least one insulating layer between the substrate and each of the at least two semiconductor chips to fill between the plurality of bumps, the at least one insulating layer having a volume in a region between the at least two semiconductor chips that is smaller than a volume in a region outside non-adjacent side surfaces of the at least two semiconductor chips.

2. The semiconductor package as claimed in claim 1, wherein the at least one insulating layer protrudes outward from the non-adjacent side surfaces of the at least two semiconductor chips farther than from adjacent side surfaces of the at least two semiconductor chips.

3. The semiconductor package as claimed in claim 2, wherein the at least one insulating layer protrudes from other side surfaces of the at least two semiconductor chips connecting respective ones of the adjacent side surfaces and the non-adjacent side surfaces, and
  a protrusion distance from the other side surfaces of the at least two semiconductor chips is greater than a protrusion distance from the adjacent side surfaces of the at least two semiconductor chips.

4. The semiconductor package as claimed in claim 1, wherein the at least one insulating layer protrudes from the non-adjacent side surfaces of the at least two semiconductor chips without protruding from adjacent side surfaces of the at least two semiconductor chips.

5. The semiconductor package as claimed in claim 1, wherein the at least one insulating layer protrudes from adjacent side surfaces of the at least two semiconductor chips without covering the adjacent side surfaces of the at least two semiconductor chips.

6. The semiconductor package as claimed in claim 1, wherein the at least one insulating layer protrudes from side surfaces of the at least two semiconductor chips farther than from corner portions of the at least two semiconductor chips.

7. The semiconductor package as claimed in claim 1, wherein the at least one insulating layer protrudes only from side surfaces of the at least two semiconductor chips without protruding from corner portions of the at least two semiconductor chips.

8. The semiconductor package as claimed in claim 1, wherein the at least two semiconductor chips includes different types of semiconductor chips.

9. The semiconductor package as claimed in claim 8, wherein the at least two semiconductor chips includes a logic chip and a memory chip.

10. The semiconductor package as claimed in claim 1, wherein the substrate is an interposer.

11. The semiconductor package as claimed in claim 1, further comprising:
a lower substrate below the substrate; and
at least one lower semiconductor chip on the lower substrate.

12. The semiconductor package as claimed in claim 11, further comprising solder balls on a lower surface of the substrate,
wherein the at least two semiconductor chips and the at least one lower semiconductor chip are electrically connected through the solder balls and the substrate.

13. The semiconductor package as claimed in claim 1, wherein the at least two semiconductor chips includes a first semiconductor chip and two second semiconductor chips disposed one side of the first semiconductor chip in parallel, and
the plurality of bumps on lower surfaces of the second semiconductor chips are arranged at a higher density in adjacent regions to the first semiconductor chips.

14. A semiconductor package, comprising:
a substrate;
a first semiconductor chip and a second semiconductor chip adjacent to each other on the substrate, the first and second semiconductor chips having facing first side surfaces and second side surfaces opposite to respective ones of the first side surfaces;
a plurality of bumps on lower surfaces of respective ones of the first and second semiconductor chips, the plurality of bumps being arranged at a higher density in first regions of respective ones of the first and second semiconductor chips than in second regions of respective ones of the first and second semiconductor chips, the first regions of the first and second semiconductor chips being adjacent to the first side surfaces of the first and second semiconductor chips, respectively, and the second regions of the first and second semiconductor chips being adjacent to the second side surfaces of the first and second semiconductor chips, respectively; and
insulating layers between the substrate and each of the first and the second semiconductor chips, each of the insulating layers having a volume in a region between the first and second semiconductor chips that is smaller than a volume in a region outside the second side surfaces of the first and second semiconductor chips, respectively.

15. The semiconductor package as claimed in claim 14, wherein the insulating layers protrude outward from the second side surfaces of the first and second semiconductor chips farther than from respective ones of the first side surfaces.

16. The semiconductor package as claimed in claim 14, wherein the insulating layers protrude from the first side surfaces of of the first and second semiconductor chips without covering the first side surfaces.

17. The semiconductor package as claimed in claim 14, wherein the insulating layers protrude from side surfaces including the first and second side surfaces of the first and second semiconductor chips farther than from corner portions of the first and second semiconductor chips.

18. The semiconductor package as claimed in claim 14, wherein the insulating layers having a higher thermal expansion coefficient than each of the first and second semiconductor chips.

19. The semiconductor package as claimed in claim 14, wherein the plurality of bumps on the lower surface of the first semiconductor chip have a substantially same size, and the plurality of bumps on the lower surface of the second semiconductor chip have a substantially same size.

20. The semiconductor package as claimed in claim 14, further comprising support bumps in the second regions, each one of the support bumps having a greater size than each of the plurality of bumps.

* * * * *